(12) United States Patent
Gerner et al.

(10) Patent No.: US 8,613,397 B2
(45) Date of Patent: Dec. 24, 2013

(54) TRANSDUCER INTERCONNECT WITH CONDUCTIVE FILMS

(75) Inventors: Bradley James Gerner, Penfield, NY (US); John R. Andrews, Fairport, NY (US); Pinyen Lin, Rochester, NY (US)

(73) Assignee: Xerox Corporation, Norwalk, CT (US)

( * ) Notice: Subject to any disclaimer, the term of this patent is extended or adjusted under 35 U.S.C. 154(b) by 0 days.

(21) Appl. No.: 13/449,853

(22) Filed: Apr. 18, 2012

(65) Prior Publication Data

US 2012/0199666 A1    Aug. 9, 2012

Related U.S. Application Data

(62) Division of application No. 12/258,126, filed on Oct. 24, 2008, now Pat. No. 8,177,335.

(51) Int. Cl.
*B05B 1/08* (2006.01)
*H01L 41/047* (2006.01)
*H02N 11/00* (2006.01)

(52) U.S. Cl.
USPC .................... 239/102.2; 310/300; 310/363

(58) Field of Classification Search
USPC ................................ 239/102.2; 310/300
See application file for complete search history.

(56) References Cited

U.S. PATENT DOCUMENTS

| | | |
|---|---|---|
| 6,345,887 B1 | 2/2002 | Sato |
| 6,471,341 B1 | 10/2002 | Yoshimura et al. |
| 7,543,918 B2 | 6/2009 | Katayama et al. |

OTHER PUBLICATIONS

Wikipedia Article: Thermosetting Polymer, Section "Examples", Oct. 3, 2012.*
Wikipedia Article: Electrical Conductor, first paragraph, downloaded from http://en.wikipedia.org/w/index.php?title=Electrical_conductor&printable=yes, last modified on Nov. 24, 2010.
ThreeBond: Product Information: 3300 series: 3372C, downloaded from http://www.threebond.com.jp/en/product/series/adhesivespotting/productdetails/3300/3372c.html on Apr. 25, 2011 (2 pages).

* cited by examiner

*Primary Examiner* — Lisa M Solomon
(74) *Attorney, Agent, or Firm* — Marger Johnson & McCollom PC

(57) ABSTRACT

An electronic device has an electronic signal source electrically connected to a signal routing circuit, an electrically activated transducer to receive electronic signals through the signal routing circuit, and an anisotropic conductive film to provide electrical continuity between the signal routing circuit and the transducer, the anisotropic conductive film having material removed adjacent the transducer to reduce mechanical loading of the transducer.

9 Claims, 4 Drawing Sheets

TRANSDUCER INTERCONNECT WITH CONDUCTIVE FILMS

RELATED CASES

This application is a divisional of, and claims priority to U.S. patent application Ser. No. 12/258,126 filed Oct. 24, 2008, now allowed.

BACKGROUND

Some electronic devices use transducers to convert electrical signals into motion or to exert a force. These transducers may be electromechanical, microelectromechanical systems (MEMS), acoustic, piezoelectric, etc. One example of this type of device is a print head, in which a transducer is activated by an electronic signal to cause ink to exit the print head through a jet or nozzle. In some examples, when the system activates the transducer with an electrical signal the transducer actuates and displaces a diaphragm or other structure that in turn causes the ink to pass through the jet onto a printing substrate.

In devices that utilize these types of transducers, such as ink jet print heads, a non-conductive adhesive standoff typically exists to hold electrical contact pads on a flexible circuit or rigid circuit board in proximity to the transducer elements. Because the adhesive standoff is non-conductive, it must posses a hole or other gap over the actuator to allow electrical interconnect to the transducer. The interconnect typically consists of a conductive adhesive placed in the opening in the standoff, in contact with the pads on the circuit element and in contact with the actuator elements, providing electrical continuity between them. A typical example of the conductive adhesive would be a silver-loaded epoxy.

The conductive epoxy is rigid in the cured state and may provide an undesirable mechanical coupling to the circuit element and between transducers. Mechanical coupling of the transducer to the circuit element results in mechanical loading of the actuator and reduced motion for a fixed voltage driving it. In many cases increasing the voltage to the actuator will compensate for the mechanical loading, but is undesirable. A second result of the mechanical coupling between the circuit element and the actuators is 'cross talk' or accidental alteration of the behavior of neighboring transducers to an activated transducer.

Other, softer, conductive adhesives seem to eliminate the mechanical cross talk, but have reduced reliability in thermal cycling. Thermal cycling figures significantly in design considerations in solid ink jet printers, as heat is applied throughout the system to keep the ink in its liquid/molten state and heat is removed when the system is turned off.

The loading of the transducer by the conductive adhesive and the circuit element typically has some variability across an array. This leads to differing deflections within the array, resulting in different drop masses of the ink drops and different speeds. This variability, if uncorrected, has negative impact on image quality Anisotropic conducting films (ACF) are widely used in flat panel display technology as the interconnect between a circuit element and display elements. These films typically have low or no conductivity in the X-Y plane that typically has large dimensions compared to the thickness but have high conductivity along the third axis, often labeled the Z-axis. As a result, these are also sometimes referred to as Z-axis conducting films. The base film may consist of a thermoset plastic, a thermoplastic, a thermoplastic adhesive or a thermoset adhesive. The film provides a matrix for electrically conducting elements that are dispersed in the film that span the z-axis and provide the electrical conduction through the film. The anisotropy of the conductivity is the result of having the conducting elements in low enough concentration that they only infrequently touch to provide limited lateral conductivity. The conducting elements are typically small metal balls, metal coated polymer balls, or oriented thin metal rods. These interconnects are normally used with stationary electrical elements and are therefore not normally concerned with the mechanical loading of a transducer.

DETAILED DESCRIPTION OF THE EMBODIMENTS

For ease of understanding of the embodiments described here, the discussion will focus on a print head as an example of an electronic device using a conductive interconnect in conjunction with transducers. However, these just serve as examples and are not intended to, nor should they be interpreted as, any limitation on the scope of the claims. The embodiments described here may apply to any fluid dispenser that dispenses fluids through an array of nozzles or jets. Similarly, the term 'printer' does not limit itself to devices that just dispense ink, solid ink or otherwise. Other materials may be dispensed by devices that have many similarities to ink printers, but may actually dispense other materials, such as biological fluids, pharmaceuticals, etc.

Figure 1:
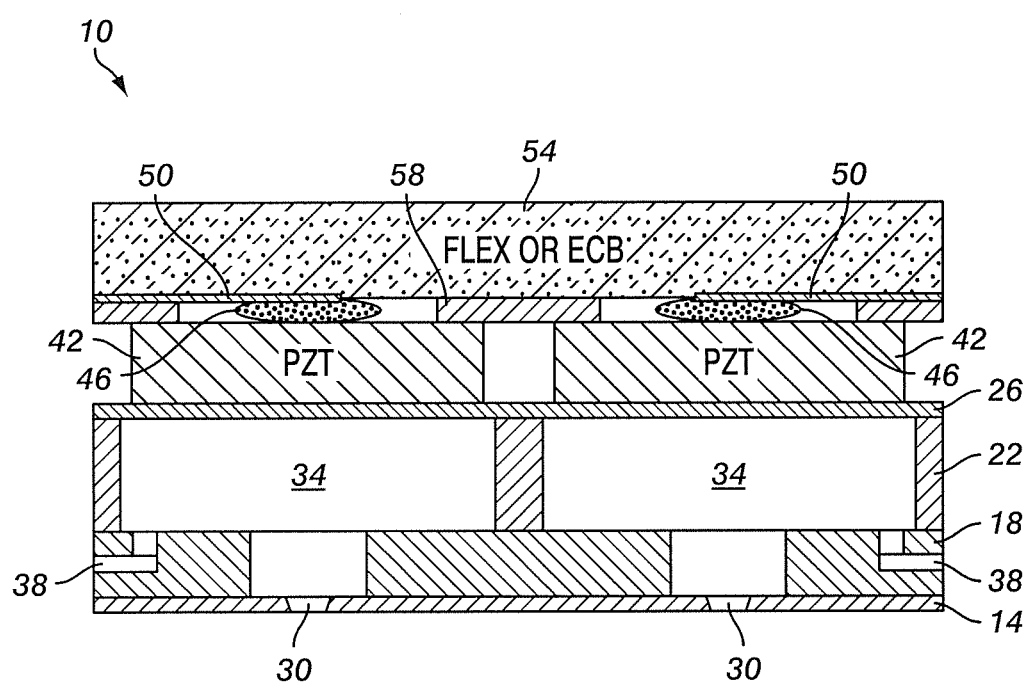
FIGS. 1 and 2 show embodiments of a current implementation of a print head using an non-conducting standoff and conductive adhesive.

FIG. 1 shows a portion of an ink jet stack in a cross-sectional side view. The ink jet stack 10 may consist of a number of plates that are mounted to one another. For example, the ink jet stack 10 may include a nozzle plate 14, an inlet plate 18, a body plate 22, and a diaphragm plate 26. These plates are assembled and bonded to one another using brazing or adhesives in a known manner to form ink jet stack 10. Additionally, the stack may include filters, heating layers or other layers. Alternatively, subassemblies may make up the ink jet stack, with the subassemblies molded or formed by other processes such as lithography or etching.

The resulting ink jet stack may have a structure similar to the one shown in FIG. 1. Regardless of the fabrication method, ink chambers 34 receive ink from an ink source through inlets 38. In response to the input of electrical energy provided through conductive adhesive 46 and an electrical contact pad 50, actuator 42 moves causing the diaphragm 26, mounted to the actuator, to deflect. The diaphragm plate 26 is made of a resilient, flexible material, such as thin stainless steel, enabling the plate to move back and forth to expel ink in one direction of movement and to draw ink into the ink chamber 34 in the other direction of movement. The ink expelled from the ink chamber 34 exits through one of the openings 30 in the nozzle plate 14.

The electrical contact pad 50 mounts to a support member 54, such as a flex cable or a multi-layer circuit board. Standoff 58 holds the support member 54 also in proximity to the actuator 42. The actuator may include piezoelectric material sandwiched between two electrode structures, which may be made of nickel, for example. The conductive adhesive 46 is in contact with the contact pad 50 and the electrode on the actuator 42 to provide electrical continuity between the signal source and the actuator.

A printhead controller, or electronic signal source, generates an electrical signal; the signal is in turn conducted by an electrical lead or signal routing circuit formed as part of the electrical contact pad 50 to the conductive adhesive and the electrode contacting the adhesive. In response to the signal from the signal source, the PZT and diaphragm deflect as shown in FIG. 2.

Figure 2:
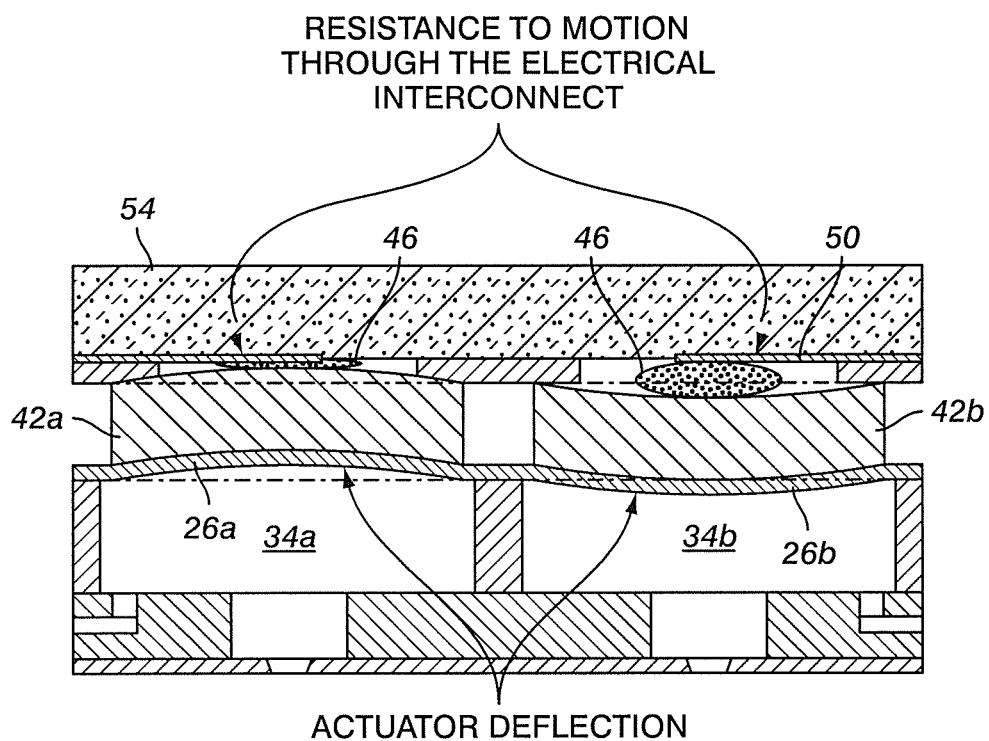

In FIG. 2, the actuator material 42a and the portion of the diaphragm 26a immediately adjacent to the actuator material have moved in response to a signal to induce ink to be pulled into the ink chamber 34a, while the actuator material 42b and the portion of the diaphragm 26b immediately adjacent that actuator material move to expel ink from the ink chamber 34b in response to a different signal. The amount of deflection shown in FIG. 2 is exaggerated for illustration purposes and is typically about one micrometer or less. The printhead controller selectively generating an electrical signal causes an ink jet stack to eject ink in an on-demand manner.

As seen in FIG. 2, the deflection of the actuator material produces a force that primarily acts upon the diaphragm to expel ink from or pull ink into the ink chambers 34. This force also operates on the conductive adhesive 46, the electrical contact 50, and the support member 54. This operation results in a mechanical load and a parasitic force on the electrical connections that decreases the deflection of the actuator. The decreased deflection reduces the force available for manipulation of the ink. Since the deflection amplitude of the actuator is much greater in the center than at the edges of the actuator, the effect of the mechanical load in the central region of the actuator is much greater than at the edges of the actuator.

Current print heads compensate by increasing the voltage for the driving signal, the size of the actuator, or other alterations of the stack structure. The size of the conductive adhesive such as silver epoxy, the distance between the actuator material 42 and the contact pad 50, and the location of the conductive adhesive with respect to each actuator and pad, are all factors that can vary across the array of ink jets in a printhead. These variations cause the mechanical loads on the actuators to vary within the array. To compensate for the different loads within the array of actuators, the voltage needs to be changed for each actuator so that similarly sized ink drops are formed from each element of the array. A process referred to as 'normalization' determines the voltages that cause the jets to dispense similarly sized ink drops. The print head controller stores these voltages in a memory for retrieval and use to operate the ink jets in a printhead.

The normalization process creates structure and processing power overhead for the printer, increasing the printer cost. Reduction of that overhead allows for lower production costs. Reducing the mechanical load to the actuator and making the load more uniform results in a print head that does not require as much normalization.

It is possible to use a uniform ACF instead of the combination of the insulating standoff and silver epoxy conductor for each transducer-contact pad pair. However, this configuration still has the mechanical loading of the transducer and the possibility for variability across the array.

Using an ACF and introducing openings centered on the transducers makes it possible to nearly completely eliminate the mechanical loading of the actuator and attendant voltage increase, variability, and cross-talk. The ACF replaces the standoff and conductive adhesive interconnect, and generally the term 'standoff' refers to separation of two electrical elements with an insulator. The ACF may be referred to as an interconnect, mechanically decoupled interconnect, mechanically decoupled ACF interconnect, or a one-dimensional conductive film.

Figure 3:
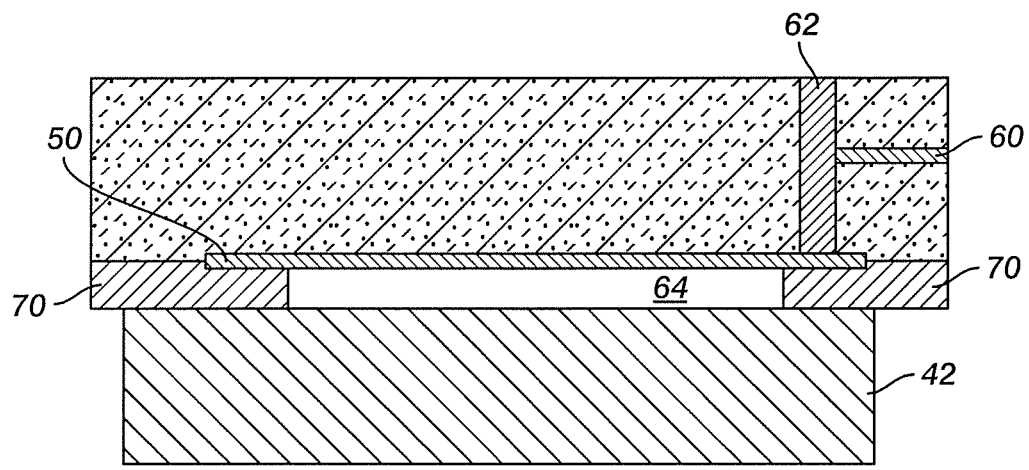
FIG. 3 shows a side view of an embodiment of a portion of a print head using an anisotropic conductive film patterned to eliminate mechanical loading.

FIG. 3 shows a side view of a print head having an interconnect with an opening over the central portion of the actuator so as to avoid strong mechanical coupling where the actuator has the greatest motion. In this embodiment, the insulative standoff 58 and the conductive adhesive 46 of FIG. 1 have been replaced with an ACF interconnect 70. Using the ACF interconnect to make the electrical connections necessary allows for a hole, opening or gap 64 to exist in the ACF interconnect, allowing the transducer to move freely. This reduces the mechanical load and resistance to motion.

FIG. 3 shows that an ACF interconnect such as 70 can make the electrical connection necessary to activate the transducer. A metal lead 60 may reside inside the inner layers of the multi-layer circuit board or flex circuit that may comprise the support member. The lead 60 makes connection to the contact pad 50 through the metalized via 62. Using the interconnect 70 allows the electrical path to connect through it to the transducer 42. The larger surface area made available by the use of an ACF interconnect permits good electrical contact at or near the edges of the transducer and allows the selective removal of material adjacent the central portion of the transducer to reduce the mechanical loading by the electrical interconnect. In the case where the polymer matrix is a thermoplastic adhesive, it is sometimes possible to remove the electrical element on one side of the interconnect by heating the thermoplastic. This ability to remove and replace an electrical element can be convenient to repair or reuse parts of the assembly.

One example of an interconnect is an anisotropic conductive film (ACF) having metal nanowires that span the z-axis embedded within it, or metal particles dispersed in a polymer matrix. For purposes of this discussion, a nanowire is a wire that has a diameter in the nanometer range ($10^{-9}$ m).

Figure 4:
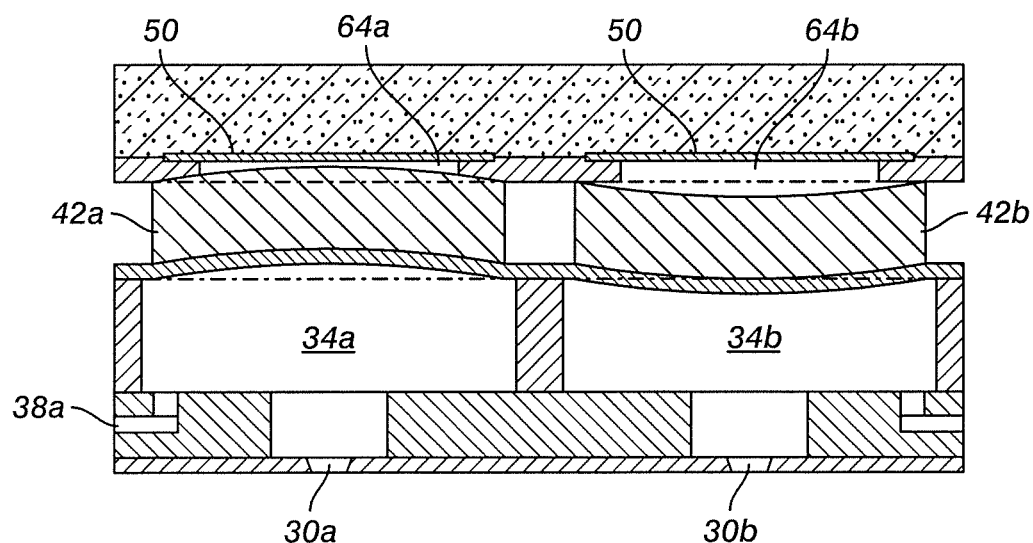
FIG. 4 shows a side view of an embodiment of a portion of a print head using a patterned anisotropic conducting film during mechanical actuation.

FIG. 4 shows an example of transducers 42a and 42b activated by electrical signals. As in FIG. 2, the transducer 42a has been activated to pull ink into the ink chamber 34a through inlet 38a and transducer 42b has been activated to push ink out of the nozzle 30b. As shown in FIG. 4, the gaps or openings 64a and 64b alleviate any mechanical loading resulting in reduced the motion of the transducers. This increases the consistency of the print head, for each nozzle over time, and across the print head from nozzle to nozzle.

Without mechanical loading, or with nominal mechanical loading, the transducer 42a may achieve the required deflection at a lower voltage than if there were a mechanical load present. Eliminating the mechanical loading and resulting coupling between adjacent actuators will also reduce cross-talk and lead to more uniform performance across the array. In addition, by reducing the number of components in the print head, the manufacturing process may be simplified.

The ACF can be pre-formed by die cutting or laser cutting of a continuous ACF film. Holes arranged adjacent to each element of the transducer remain small enough to contact the edges of the actuator. The key limitation to the size of the opening is that enough material has to remain to allow electrical connection. In a specific example, the patterned ACF film is tacked to the actuator array with heat and pressure. Finally a circuit board is aligned on top of the patterned ACF and the material bonded at 160 degrees Celsius and a pressure of 30 PSI for 10 seconds. The exact process parameters for assembling the electrical circuit elements with the ACF will depend on the specific characteristics of the film.

Figure 5:
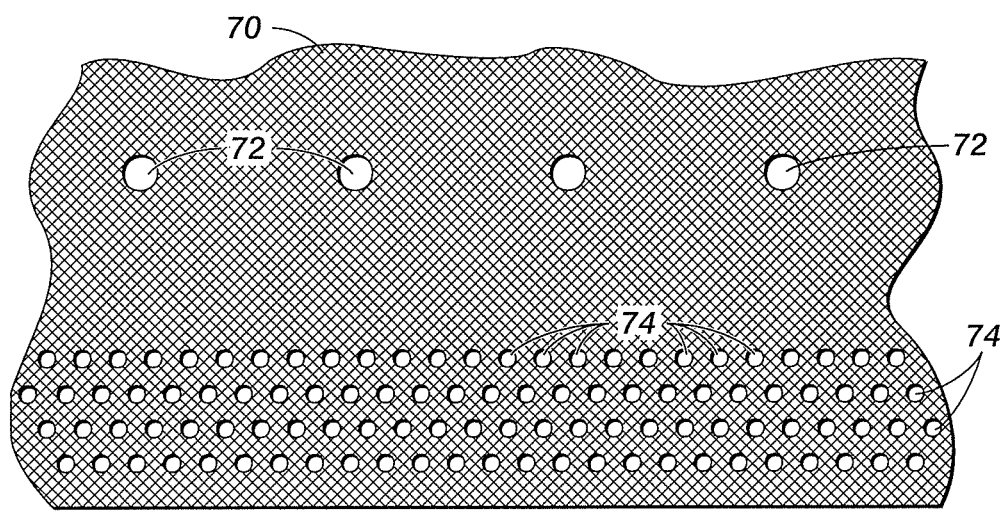
FIG. 5 shows an embodiment of a patterned interconnect cut from an anisotropic conducting film.

Using a nanowire ACF as the interconnect provides several advantages. Generally, this material is available in large sheets. It can be die or laser cut, depending upon the features and their accuracy requirements. FIG. 5 shows an example of an electrically conductive adhesive interconnect for a print head application.

The interconnect 70 has a pattern of holes such as 74 to allow better movement of the PZT elements in an array of PZTs. This pattern has somewhat high precision requirements that are easily obtained by either die or laser cutting. The interconnect 70 can also have pattern of holes such as 72 as ink port holes to allow the ink flow into the ink chamber.

In some electronic devices, the interconnect undergoes laser cutting, so this material easily works into existing manufacturing processes. In addition, one available nanowire ACF consists of a thermoplastic polyimide that bonds at 160 degrees Celsius in less than three seconds, and is available in sheet form, allowing easy shaping and laser cutting. The ACF may be bonded first to the transducer array on one of its sides, referred to here as the transducer side, and then to the signal routing or carrying circuit on its other side, referred to here as its circuit side. Alternatively, the signal circuit may be bonded to the ACF first and then the ACF bonded to the transducer array, or they could be bonded simultaneously.

In addition to reducing the number of process steps, an ACF interconnect provides both thermal and electrical conductivity and increased thermal conductance that allows for more thermally efficient transfer of heat from the electrical side to the jet stack from a heater that resides on the back. In some examples, the adhesive bonds faster, reducing processing time. The ability to easily remove material without alignment constraints increases transducer efficiency without burdening the manufacturing process. Reliability increases due to the elimination of conductive epoxy cracking. Using the nanowire ACF also provides the potential to migrate to higher transducer densities if needed.

It will be appreciated that several of the above-disclosed and other features and functions, or alternatives thereof, may be desirably combined into many other different systems or applications. Also that various presently unforeseen or unanticipated alternatives, modifications, variations, or improvements therein may be subsequently made by those skilled in the art which are also intended to be encompassed by the following claims.

What is claimed is:

1. An electronic device, comprising:
   an electronic signal source electrically connected to a signal routing circuit;
   an electrically activated transducer to receive electronic signals through the signal routing circuit; and
   an anisotropic conductive film to provide electrical continuity between the signal routing circuit and the transducer, the anisotropic conductive film having material removed adjacent the transducer to reduce mechanical loading of the transducer, and the anistropic film having embedded metal nanowires that span a z-axis.

2. The device of claim 1, wherein the electrically activated transducer comprises one of a piezoelectric transducer, a microelectromechanical system transducer, or an audio transducer.

3. The device of claim 1, wherein the conductive film comprises a polymer material having the metal nanowires embedded therein.

4. The device of claim 3 wherein the polymer material comprises a thermoset adhesive.

5. The device of claim 3, wherein the polymer material comprises thermoplastic adhesive.

6. The polymer material of claim 5 that can be reheated to remove or replace circuit elements.

7. The device of claim 1, wherein the signal routing circuit comprises a signal trace on one of either a flexible electronic circuit substrate or an electronic circuit board.

8. The device of claim 1, the device further comprising:
   a diaphragm arranged adjacent the transducer;
   a fluid reservoir arranged adjacent the diaphragm on a side opposite the transducer; and
   a jet arranged adjacent the fluid reservoir on a side opposite the diaphragm, such that when the transducer is activated to cause the diaphragm to deflect, fluid in the reservoir is expelled through the jet.

9. The device of claim 1, wherein an amount of material removed from the anisotropic conducting film adjacent to each transducer depends upon the desired levels of electrical continuity and a reduction of mechanical load.

\* \* \* \* \*